US012241942B2

United States Patent
Lee et al.

(10) Patent No.: US 12,241,942 B2
(45) Date of Patent: Mar. 4, 2025

(54) METHOD FOR ESTIMATING AGING STATE OF BATTERY AND APPARATUS FOR PERFORMING METHOD THEREFOR

(71) Applicant: Research & Business Foundation SUNGKYUNKWAN UNIVERSITY, Suwon-si (KR)

(72) Inventors: Sukhan Lee, Suwon-si (KR); A Reum Kim, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 508 days.

(21) Appl. No.: 17/540,545

(22) Filed: Dec. 2, 2021

(65) Prior Publication Data

US 2022/0206078 A1 Jun. 30, 2022

(30) Foreign Application Priority Data

Dec. 31, 2020 (KR) ........................ 10-2020-0189903

(51) Int. Cl.
*G01R 31/392* (2019.01)
*G01R 31/3842* (2019.01)
*G06N 3/08* (2023.01)

(52) U.S. Cl.
CPC ....... *G01R 31/392* (2019.01); *G01R 31/3842* (2019.01); *G06N 3/08* (2013.01)

(58) Field of Classification Search
CPC ............ G01R 31/392; G01R 31/3842; G01R 31/386; G01R 31/367; G01R 19/003;
(Continued)

(56) References Cited

U.S. PATENT DOCUMENTS

| 11,300,623 B2* | 4/2022 | Badwekar ............ G01R 31/392 |
| 11,637,331 B2* | 4/2023 | Chemali ................ G06N 3/044 |
| | | 702/63 |
| 2022/0170995 A1* | 6/2022 | Simonis .................. B60L 58/16 |

FOREIGN PATENT DOCUMENTS

| CN | 103778280 A | 5/2014 |
| CN | 111611747 A | 9/2020 |

(Continued)

OTHER PUBLICATIONS

KR-102335180-B1_Translated (Year: 2021).*
(Continued)

*Primary Examiner* — Natalie Huls
*Assistant Examiner* — Michael J Singletary
(74) *Attorney, Agent, or Firm* — NSIP Law

(57) ABSTRACT

A method for estimating a battery aging state is provided. The method includes receiving measurement values of a battery from a battery management system, calculating factors representing change characteristics of each of a discharge voltage and a discharge current in each of charge/discharge cycles by using the measurement values of the battery; and estimating, based on an n-dimensional vector including the calculated factors, the battery aging state by using a machine learning model that is pre-trained by using, as an input vector, an n-dimensional vector including factors representing change characteristics of each of a discharge voltage and a the discharge current in each of charge/discharge cycles of each battery for training using measurement values of the battery for training.

19 Claims, 12 Drawing Sheets

(58) Field of Classification Search
CPC .... G01R 31/3648; G01R 31/382; G06N 3/08;
G06N 3/044; G06N 20/00; H01M
2010/4271; H01M 2010/4278; H01M
2220/20
See application file for complete search history.

(56) References Cited

FOREIGN PATENT DOCUMENTS

| CN | 112098873 | A |   | 12/2020 |
|----|-----------|---|---|---------|
| CN | 112305423 | A | * | 2/2021  |
| KR | 20210003596 | A | * | 1/2021 |
| KR | 102216924 | B1 | * | 2/2021 |
| KR | 102335180 | B1 | * | 12/2021 |
| KR | 20220078003 | A | * | 6/2022 |
| WO | WO 2019/162749 | A1 |  | 8/2019 |

OTHER PUBLICATIONS

CN-112305423-A_Translated (Year: 2021).*
KR-20220078003-A_Translated (Year: 2022).*
KR-102216924-B1_Translated (Year: 2020).*
KR-20210003596-A_Translated (Year: 2021).*
Bak, Taejun, et al. "Accurate Estimation of Battery SOH and RUL Based on a Progressive LSTM with a Time Compensated Entropy Index." Annual Conference of the PHM Society. vol. 11. No. 1. 2019, (10 pages in English).
Korean Office Action issued on May 31, 2023, in counterpart Korean Patent Application No. 10-2020-0189903 (4 pages in English, 4 pages in Korean).
Korean Office Action issued on Aug. 30, 2024, in counterpart Korean Patent Application No. 10-2020-0189903 (3 pages in English, 6 pages in Korean).

* cited by examiner

FIG. 7

| TEST ITEM | TRAINING DATA | TEST DATA | EXPERIMENT INDEX |
|---|---|---|---|
| BATTERY IS DISCHARGED WITH CONSTANT CURRENT | CS2_33x2, CS2_35, CS2_37, CS2_38 | CS2_34, CS2_36 | EXPERIMENT 1 |
| | CS2_33(60%) CS2_34(60%) CS2_35(60%) CS2_37(60%) CS2_38(60%) | CS2_34(40%) CS2_35(40%) | EXPERIMENT 2 |
| DISCHARGE CURRENT IS CHANGED FOR EACH CYCLE | CS2_3(60%) | CS2_3(40%) | EXPERIMENT 3 |
| BATTERY IS DISCHARGED WITH CONSTANT CURRENT + DISCHARGE CURRENT IS CHANGED FOR EACH CYCLE | CS2_33x2, CS2_35, CS2_38, CS2_3(60%)x3 | CS2_34, CS2_36, CS2_3(40%) | EXPERIMENT 4 |
| | CS2_33(60%) CS2_34(60%) CS2_35(60%) CS2_38(60%) CS2_3(60%)x2 | CS2_34(40%) CS2_35(40%) CS2_3(40%) | EXPERIMENT 5 |

FIG.8

| TEST ITEM | EXPERIMENT INDEX | TEST DATA | RESULT RMSE | RESULT R² |
|---|---|---|---|---|
| BATTERY IS DISCHARGED WITH CONSTANT CURRENT | EXPERIMENT 1 | 0.55A | 0.01327 | 0.99053 |
| | | 1.1A | 0.00927 | 0.99796 |
| | EXPERIMENT 2 | 0.55A(40%) | 0.01032 | 0.99397 |
| | | 1.1A(40%) | 0.01812 | 0.98565 |
| DISCHARGE CURRENT IS CHANGED FOR EACH CYCLE | EXPERIMENT 3 | CS2_3(40%) | 0.00613 | 0.99245 |
| BATTERY IS DISCHARGED WITH CONSTANT CURRENT + DISCHARGE CURRENT IS CHANGED FOR EACH CYCLE | EXPERIMENT 4 | 0.55A(40%) | 0.01165 | 0.99233 |
| | | 1.1A(40%) | 0.01699 | 0.98738 |
| | | CS2_3(40%) | 0.00741 | 0.98788 |
| | EXPERIMENT 5 | 0.55A | 0.02787 | 0.95827 |
| | | 1.1A | 0.02719 | 0.98251 |
| | | CS2_3(40%) | 0.00854 | 0.98537 |

FIG. 9

| VOLTAGE INTERVAL | VOLTAGE RANGE | AVERAGE | |
| --- | --- | --- | --- |
| | | RMSE | $R^2$ |
| 0.7 | 4.1~3.4 | 0.014784191 | 0.983098157 |
| | 3.9~3.2 | 0.012896567 | 0.986190833 |
| | 3.7~3.0 | 0.044491084 | 0.871907433 |
| 0.5 | 4.1~3.6 | 0.014440099 | 0.983852643 |
| | 3.9~3.4 | 0.011261865 | 0.989306637 |
| | 3.7~3.2 | 0.058215523 | 0.759118653 |
| | 3.5~3.0 | 0.051731259 | 0.811196413 |
| 0.3 | 4.1~3.8 | 0.020651104 | 0.966294817 |
| | 3.9~3.6 | 0.012135147 | 0.987162013 |
| | 3.7~3.4 | 0.05203451 | 0.822683937 |
| | 3.5~3.2 | 0.04984381 | 0.828396593 |
| | 3.3~3.0 | 0.049637727 | 0.829454363 |

FIG.11

| TEST ITEM | TRAINING DATA | TEST DATA | RESULT RMSE | RESULT $R^2$ |
|---|---|---|---|---|
| DISCHARGE CURRENT IS RANDOMLY CHANGED | RANDOM CURRENT DATA (ONE) (60%) | RANDOM CURRENT DATA (ONE) (40%) | 0.0018478454 | 0.99134743 |
| | RANDOM CURRENT DATA (THREE) (60%) | RANDOM CURRENT DATA (ONE) (40%) | 0.004138677 | 0.9565952 |
| | RANDOM CURRENT DATA (TWO) (ALL) | RANDOM CURRENT DATA (ONE) (ALL) | 0.004900042 | 0.9563834 |

METHOD FOR ESTIMATING AGING STATE OF BATTERY AND APPARATUS FOR PERFORMING METHOD THEREFOR

CROSS-REFERENCE TO RELATED APPLICATION

This application claims priority to Korean Patent Application No. 10-2020-0189903, filed on Dec. 31, 2020. The entire contents of the application on which the priority is based are incorporated herein by reference.

TECHNICAL FIELD

The present disclosure relates to a method for estimating an aging state of a battery and an apparatus for performing the method.

BACKGROUND

As an indicator of an aging state of a battery, a state of health (SOH) is used. The SOH defines the maximum charge capacity in each charge/discharge cycle as a percentage in a condition that the maximum charge capacity in the specification of the initial unaged battery is 100%. Further, the time when the maximum charge capacity is reduced to 80%, that is, the SOH reaches 80% is defined as a battery replacement time. In order to efficiently manage a system using a battery such as an electric vehicle, it is important to accurately estimate and predict the SOH of the battery. However, because of the electrical and chemical complexity of the battery, it is difficult to accurately estimate the SOH of the battery.

Conventional methods for estimating the aging state of a battery include a direct measurement approach, a model-based approach, and a data-based approach, and the like.

The direct measurement approach is a method of estimating the SOH of a battery by generating a look-up table by measuring internal resistance and a current of the battery, and the model-based approach is a method of estimating the SOH of a battery by obtaining a state equation through a circuit model of the battery and then updating measurement values. However, these approaches are disadvantageous in that the real-time estimation of the SOH is difficult because data should be measured while the battery operation is stopped. Further, it is difficult to reflect the influence of external environment or noise in the process of setting a battery model, resulting in poor accuracy.

The data-based approach is a method of estimating the aging state of a battery by training a machine learning model such as a neural network and a support vector machine (SVM) by using battery data obtained through the actual measurement. The data-based approach greatly depends on the quality of the collected data. However, since data collection is generally performed in the limited conditions of the simulation environment in the laboratory, there is a problem that errors occur when the collected data is applied to the actual environment.

In particular, the conventional data-based approach does not consider the temporal change of the discharge current according to the change of the load in every charge/discharge cycle of the battery, and there is a problem that it is difficult to accurately predict the SOH when full charge and complete discharge according to the specification do not occur during charge and discharge.

Related Art

Patent Document 1: Korean Patent Application Publication No. 10-2017-0058165

SUMMARY

The present disclosure provides a method for estimating an aging state of a battery and an apparatus for performing the method considering an actual usage environment. The method and the apparatus may estimate a state of health (SOH) of the battery independently of a temporal change of a discharge current according to a change of a load in every charge/discharge cycle while considering a case in which the battery is not fully charged and completely discharged.

Technical objects to be achieved by the present disclosure are not limited to those described above, and other technical objects not mentioned above may also be clearly understood from the descriptions given below by those skilled in the art to which the present disclosure belongs.

In accordance with an aspect of the present disclosure, there is provided a method for estimating an aging state of a battery, the method including: receiving measurement values of the battery from a battery management system; calculating factors representing change characteristics of each of a discharge voltage and a discharge current in each of charge/discharge cycles by using the measurement values of the battery; and estimating, based on an n-dimensional vector (n is a natural number) including the calculated factors, the aging state of the battery by using a machine learning model that is pre-trained by using, as an input vector, an n-dimensional vector including factors representing change characteristics of each of a discharge voltage and a discharge current in each of charge/discharge cycles of each battery for use in training by using measurement values of the battery for use in training. Further, the aging state of the battery is estimated while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles. Further, the machine learning model is pre-trained while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles.

Further, the factors may include a discharge voltage distribution entropy, a quantity of discharged electric charge, an average of the discharge current, and a discharge time, and further include at least one of a discharge current variance and a discharge current distribution entropy.

Further, the discharge voltage distribution entropy may be calculated by compensating a discharge voltage drop occurred by internal resistance of the battery, generating a histogram for the compensated discharge voltage, and using a probability of each section of the histogram.

Further, the compensated discharge voltage may be calculated by an equation $V=IR_i$. Here, V is the compensated discharge voltage, I is the discharge current, and $R_i$ is the internal resistance.

Further, the internal resistance may be calculated by an equation $R_i = a \times SOH + b$. Here, $R_i$ is the internal resistance, SOH is a state of health of the battery, and a and b are coefficients determined according to a characteristic of the battery.

Further, the discharge voltage distribution entropy may be calculated by an equation $$H(x) = -\sum_{i=1}^{N} p(x_i)\log_b p(x_i).$$

Here, H(x) is the discharge voltage distribution entropy, $x_i$ is an i-th section of the histogram, $p(x_i)$ is a probability that a voltage corresponding to the $x_i$ appears, and N is the number of sections.

Further, in the calculating of the factors, the factors may be calculated by using, among the measurement values of the battery, measurement values measured in a predetermined partial voltage range that is effective in estimating a state of health (SOH) in a case in which charging and discharging of the battery are not fully performed.

Further, the machine learning model may be a long-short term memory.

Further, each component of the n-dimensional vector may be converted into a value between 0 and 1 and input to the machine learning model by an equation $$x_{scale} = \frac{x - x_{min}}{x_{max} - x_{min}}.$$

Here, x is each component of the n-dimensional vector before the conversion, $x_{scale}$ is each component of the n-dimensional vector after the conversion, $x_{min}$ is the minimum value of x, and $x_{max}$ is the maximum value of x.

In accordance with another aspect of the present disclosure, there is provided an apparatus for estimating an aging state of a battery, the apparatus including: a communication unit configured to receive measurement values of the battery from a battery management system; a preprocessor configured to calculate factors representing change characteristics of each of a discharge voltage and a discharge current in each of charge/discharge cycles by using the measurement values of the battery; and an estimating unit configured to estimate, based on an n-dimensional vector (n is a natural number) including the calculated factors, the aging state of the battery by using a machine learning model that is pre-trained by using, as an input vector, an n-dimensional vector including factors representing change characteristics of each of a discharge voltage and a discharge current in each of charge/discharge cycles of each battery for use in training by using measurement values of the battery for use in training. Further, the aging state of the battery is estimated while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles. Further, the machine learning model is pre-trained while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles.

Further, the factors may include a discharge voltage distribution entropy, a quantity of discharged electric charge, an average of the discharge current, and a discharge time, and further include at least one of a discharge current variance and a discharge current distribution entropy.

Further, the discharge voltage distribution entropy may be calculated by compensating a discharge voltage drop occurred by internal resistance of the battery, generating a histogram for the compensated discharge voltage, and using a probability of each section of the histogram.

Further, the compensated discharge voltage may be calculated by an equation V=IR$_i$. Here, V is the compensated discharge voltage, I is the discharge current, and R$_i$ is the internal resistance.

Further, the internal resistance may be calculated by an equation R$_i$=a×SOH+b. Here, R$_i$ is the internal resistance, SOH is a state of health of the battery, and a and b are coefficients determined according to a characteristic of the battery.

Further, the discharge voltage distribution entropy may be calculated by an equation $$H(x) = -\sum_{i=1}^{N} p(x_i)\log_b p(x_i).$$

Here, H(x) is the discharge voltage distribution entropy, $x_i$ is an i-th section of the histogram, $p(x_i)$ is a probability that a voltage corresponding to the $x_i$ appears, and N is the number of sections.

Further, the preprocessor may be configured to calculate the factors by using, among the measurement values of the battery, measurement values measured in a predetermined partial voltage range that is effective in estimating a state of health (SOH) in a case in which charging and discharging of the battery are not fully performed.

Further, the machine learning model may be a long-short term memory.

Further, each component of the n-dimensional vector may be converted into a value between 0 and 1 and input to the machine learning model by an equation $$x_{scale} = \frac{x - x_{min}}{x_{max} - x_{min}}.$$

Here, x is each component of the n-dimensional vector before the conversion, $x_{scale}$ is each component of the n-dimensional vector after the conversion, $x_{min}$ is the minimum value of x, and $x_{max}$ is the maximum value of x.

In accordance with still another aspect of the present disclosure, there is provided a battery aging state estimating apparatus that is implemented outside a transportation means including a battery and is capable of communicating with the transportation means in a wireless communication manner, the battery aging state estimating apparatus including: a communication unit configured to receive measurement values of the battery from a battery management system; a preprocessor configured to calculate factors representing change characteristics of each of a discharge voltage and a discharge current in each of charge/discharge cycles by using the measurement values of the battery; and an estimating unit configured to estimate, based on an n-dimensional vector (n is a natural number) including the calculated factors, the aging state of the battery by using a machine learning model that is pre-trained by using, as an input vector, an n-dimensional vector including factors representing change characteristics of each of a discharge voltage and a discharge current in each of charge/discharge cycles of each battery for use in training by using measurement values of the battery for use in training. Further, the aging state of the battery is estimated while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles. Further, the machine learning model is pre-trained while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles.

The disclosed technique may have the following effects. However, this does not mean that a specific embodiment should include all of the following effects or only the following effects, so it should not be understood that the scope of the disclosed technique is limited thereby.

According to the method for estimating the aging state of the battery and the apparatus for performing the method according to the above-described embodiments of the present disclosure, it is possible to estimate the aging state of the battery in real time, and inform a user to make the user design an efficient driving plan. In addition, a recently developing condition based maintenance (CBM) service may be enhanced.

BRIEF DESCRIPTION OF THE DRAWINGS

FIG. 7 shows a table illustrating training data and test data used in experiments to which the battery aging state estimating method according to the embodiment of the present disclosure is applied.

FIG. 8 shows a table illustrating results of the experiments to which the battery aging state estimating method according to the embodiment of the present disclosure is applied.

FIG. 9 shows a table illustrating results of experiments to which the battery aging state estimating method is applied by using battery measurement values of a partial range of the entire voltage range from an upper limit cutoff voltage to a lower limit cutoff voltage according to the embodiment of the present disclosure.

FIG. 11 shows a table illustrating results of experiments to which the battery aging state estimating method according to the embodiment of the present disclosure is applied in a case where a discharge current is randomly changed within each discharge cycle.

DETAILED DESCRIPTION

Figure 1:
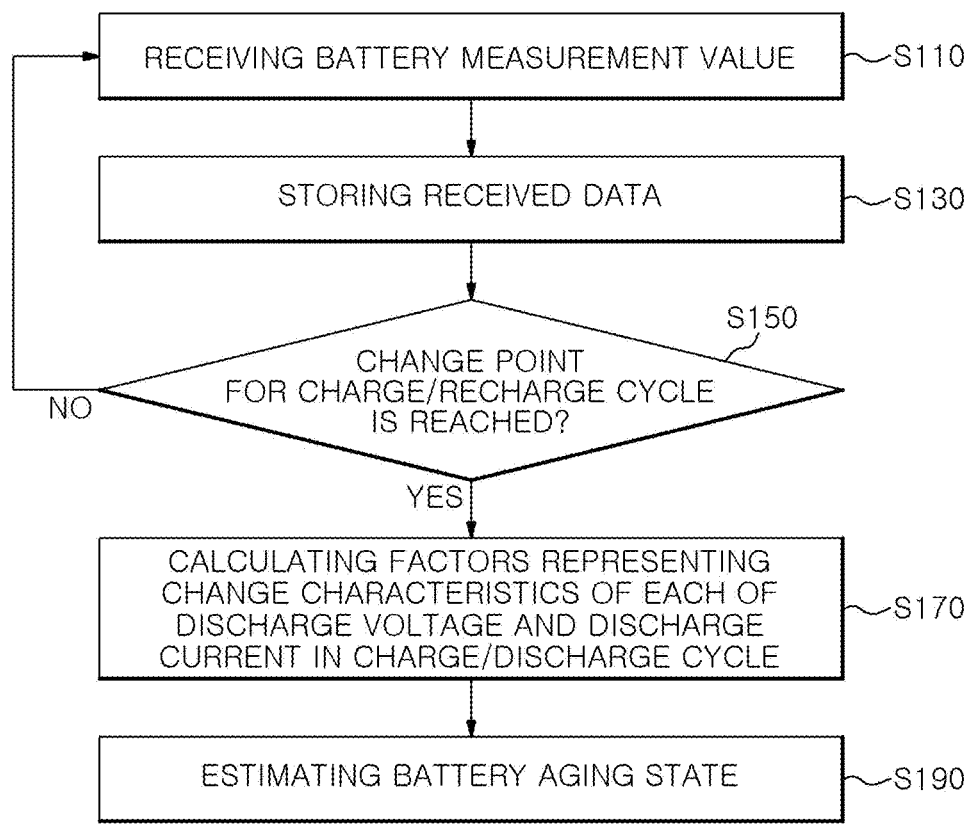
FIG. 1 shows a flowchart illustrating a method for estimating an aging state of a battery according to an embodiment of the present disclosure.

Since various modifications can be made in the present disclosure and the present disclosure can have various embodiments, exemplary embodiments are illustrated in the drawings and described in detail.

However, this is not intended to limit the present disclosure to the specific embodiments, and it should be understood that it includes all modifications, equivalents and substitutes included in the idea and scope of the present disclosure.

Terms such as first, second, etc. may be used to describe various components, but the components should not be limited by the terms. The above terms are used only for the purpose of distinguishing one component from others. For example, without departing from the scope of the present disclosure, the first component may be referred to as the second component, and similarly, the second component may also be referred to as the first component.

When a component is referred to as being "linked" or "connected" to another component, it may be directly linked or connected to the component, but it should be understood that other components may exist in between. On the other hand, when it is described that a certain component is "directly linked" or "directly connected" to another component, it should be understood that other components does not exist in between.

The terms used in the present application are only used to describe the exemplary embodiments, and are not intended to limit the present disclosure. The singular expression includes the plural expression unless the context clearly indicates otherwise. In the present application, since terms such as "include" or "have" are intended to designate that a feature, number, step, operation, component, part, or combination thereof described in the specification exists, it should be understood that this does not preclude the probability of the presence or addition of one or more other features, numbers, steps, operations, components, parts, or combinations thereof.

Unless defined otherwise, all terms used herein, including technical or scientific terms, have the same meaning as commonly understood by those skilled in the art to which the present disclosure belongs. Terms such as those defined in a commonly used dictionary should be interpreted as having a meaning consistent with the meaning in the context of the related art, and should not be interpreted in an ideal or excessively formal meaning unless it is explicitly defined in the present application.

Hereinafter, with reference to the accompanying drawings, exemplary embodiments of the present disclosure will be described clearly and in detail so that those skilled in the art to which the present disclosure belongs can easily execute the present disclosure.

FIG. 1 shows a flowchart illustrating a method for estimating an aging state of a battery according to an embodiment of the present disclosure.

Referring to FIG. 1, in step S110, a battery measurement value on a time domain is received from a battery management system (BMS). The BMS may be an electronic system for monitoring a state of the battery and managing the battery. For example, one or more battery measurement values may include at least one of a voltage, a current, an internal resistance, a temperature, a power, and a state of charge (SOC).

In step S130, the received battery measurement value is stored.

In step S150, it is determined whether a change point for a charge/discharge cycle of the battery is reached (that is, it is determined whether a change from the discharging to the charging in the charge/discharge cycle is about to occur). If the change point for the charge/discharge cycle of the battery is reached, the process proceeds to step S170, and if the change point for the charge/discharge cycle of the battery is not reached, the process returns to step S110. If sufficient data is collected for estimating the aging state of the battery through step S150, the accuracy of the result of estimating the aging state of the battery may be improved. Here, the charge/discharge cycle indicates that the charging and discharging of the battery are performed once.

In step S170, factors representing change characteristics of each of the discharge voltage and the discharge current in the discharge cycle of the charge/discharge cycle are calculated by using the stored battery measurement values. Here, the factors representing the change characteristics of each of the discharge voltage and the discharge current in the discharge cycle of the charge/discharge cycle include discharge voltage distribution entropy, a quantity of discharged electric charge, an average of the discharge current, discharging time, and further include at least one of a discharge current variance and discharge current distribution entropy. Since a user does not always fully charge and completely discharge the battery, step S170 may be performed by using, instead of all the battery measurement values in the entire voltage range from an upper limit cutoff voltage to a lower limit cutoff voltage, battery measurement values in a partial range of the entire voltage range. A detailed operation of step S170 will be described later with reference to FIGS. 2A to 4.

In step S190, the aging state of the battery is estimated by using a pre-trained machine learning model. As an example of the machine learning model, a neural network, a support vector machine (SVM), a random forest, or a long-short term memory (LSTM) may be used. An input of the machine learning model may be an n-dimensional vector ("n" is a natural number) including at least one of the discharge voltage distribution entropy, the quantity of the discharged electric charge, the average of the discharge current, the discharging time, the discharge current variance, and the discharge current distribution entropy.

FIGS. 2A to 2D show graphs illustrating a change of the discharge voltage over time (FIG. 2A), a change in entropy for each discharge current (FIG. 2B), a change in a quantity of discharged electric charge (FIG. 2C), and a change in voltage distribution (FIG. 2D) according to the aging state of the battery.

Figure 2A:
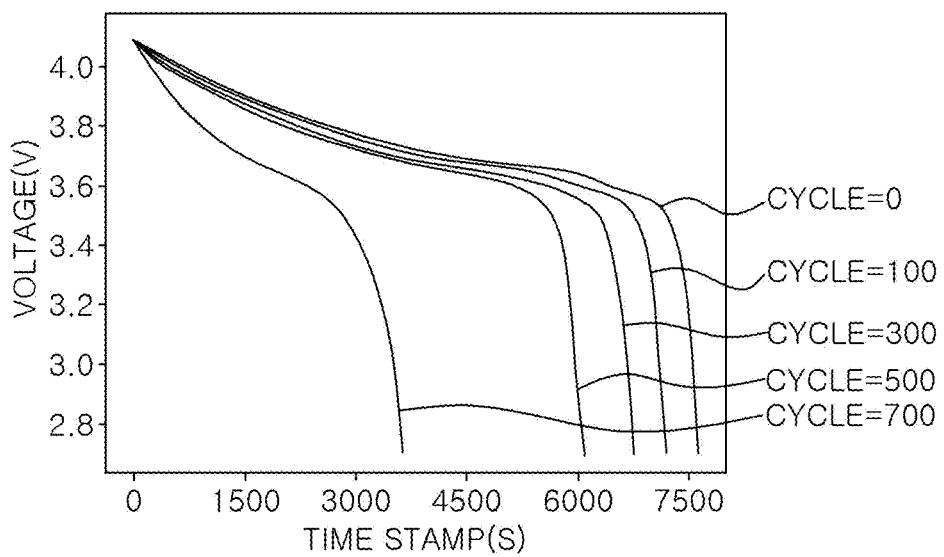
FIGS. 2A to 2D show graphs illustrating a change of the discharge voltage over time (FIG. 2A), a change in entropy for each discharge current (FIG. 2B), a change in a quantity of discharged electric charge (FIG. 2C), and a change in voltage distribution (FIG. 2D) according to the aging state of the battery.
Figure 2B:
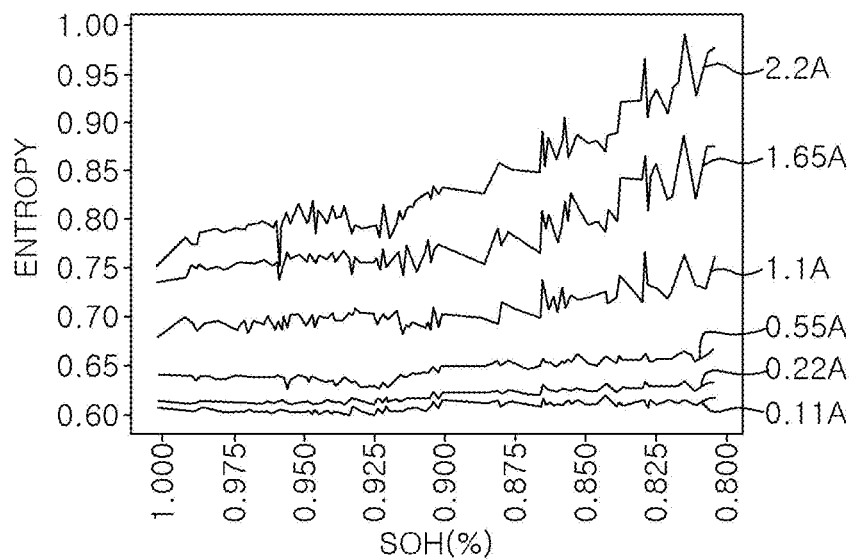
Figure 2C:
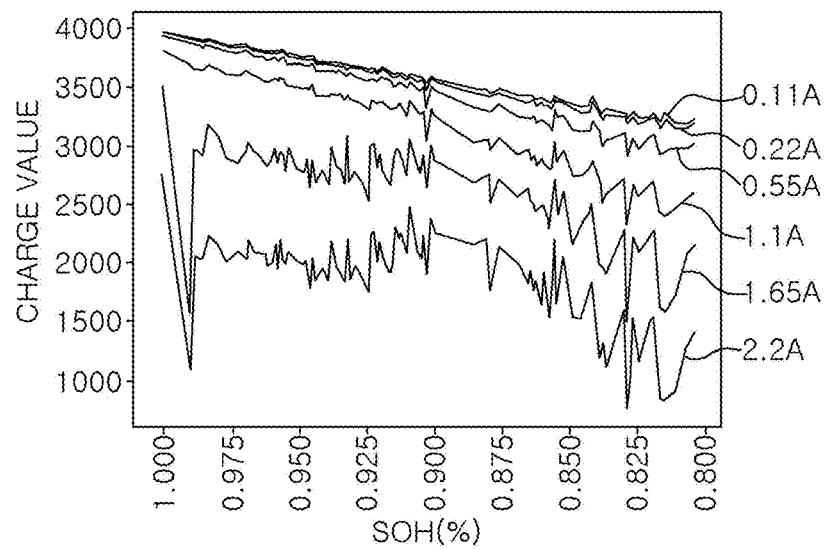
Figure 2D:
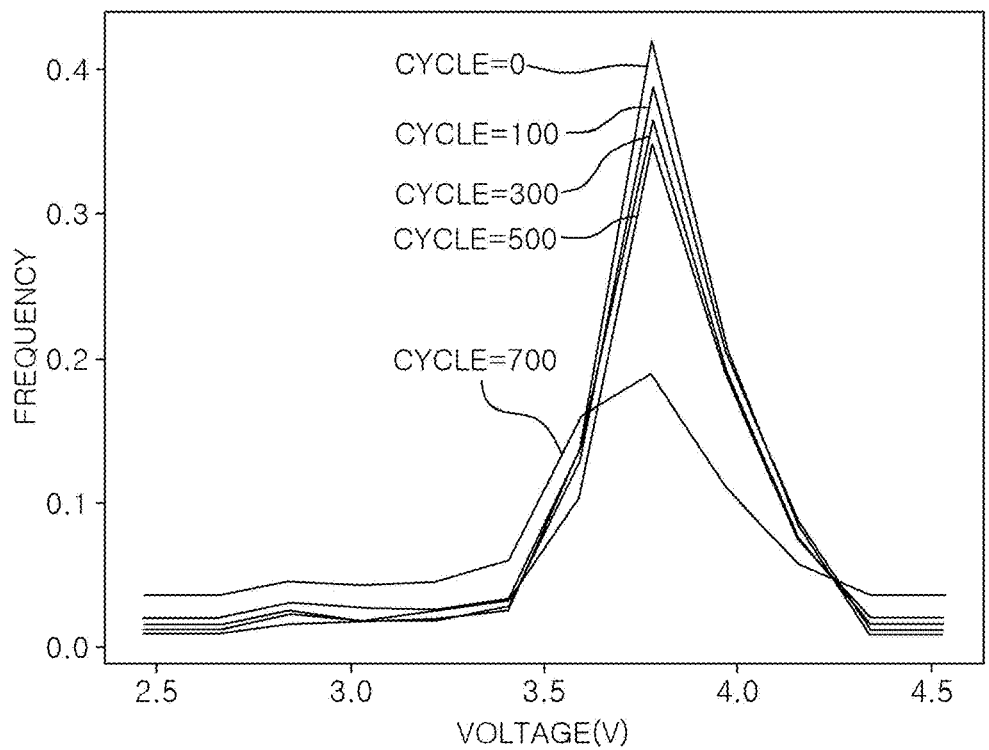

Referring to FIGS. 2A to 2D, when the charging and discharging of the battery are repeated, battery aging occurs. As the battery ages (as the discharge cycle increases), it has a characteristic that the voltage distribution becomes smooth as shown in the histogram of FIG. 2D. This characteristic may be expressed by using entropy. The entropy is a value indicating uncertainty in information. If all events have the same probability to occur, the uncertainty is the maximum and the entropy increases. If the discharge current is constant for every discharge cycle, the change in the discharge voltage distribution entropy for each magnitude of the discharge current according to the battery aging is as shown in FIG. 2B. As the battery ages, the entropy increases, and the more battery ages, the greater the entropy increase. As described above, the method for estimating the battery aging state according to the embodiment of the present disclosure uses the discharge voltage distribution entropy and the discharge current distribution entropy as inputs of the machine learning model. A method for calculating the entropy will be described later with reference to FIGS. 3A to 3D.

The quantity of the discharged electric charge shown in FIG. 2C may be calculated by integrating the discharge current with respect to time as shown in an equation 1. In the equation 1, Q indicates the quantity of the discharged electric charge, and I indicates the discharge current. The quantity of the discharged electric charge decreases as the battery ages. The larger the discharge current, the smaller the quantity becomes, and it is more affected by noise.

$$Q = \int I(t)dt \qquad \text{<Equation 1>}$$

Meanwhile, according to the aging state of the battery (that is, according to the change in the SOH), the discharge voltage distribution entropy and the quantity of the discharged electric charge are affected and changed by a load current. In particular, in the case of an actual usage environment in which the load current changes, an effect according to a change pattern of the load current may be also considered. Therefore, in order to accurately estimate the SOH, the magnitude or change of the load current may be included as predictive parameters in addition to the discharge voltage distribution entropy and the quantity of the discharged electric charge.

However, the effect of the change of the load current on the relationship between the SOH and the discharge voltage distribution entropy and the relationship between the SOH and the quantity of the discharged electric charge has a complex nonlinear characteristic. Therefore, it is difficult to solve such effect with a simple mathematical compensation method. Accordingly, in the method for estimating the aging state of the battery according to the embodiment of the present disclosure, the effect of the load current on the SOH is compensated by training the machine learning model by including an average of the discharge current, the discharging time and the discharge current distribution entropy as well as the discharge voltage distribution entropy and the quantity of the discharged electric charge in an input vector.

FIGS. 3A to 3D show graphs illustrating a process for calculating voltage distribution entropy from battery voltage distribution for one discharge cycle.

Figure 3B:
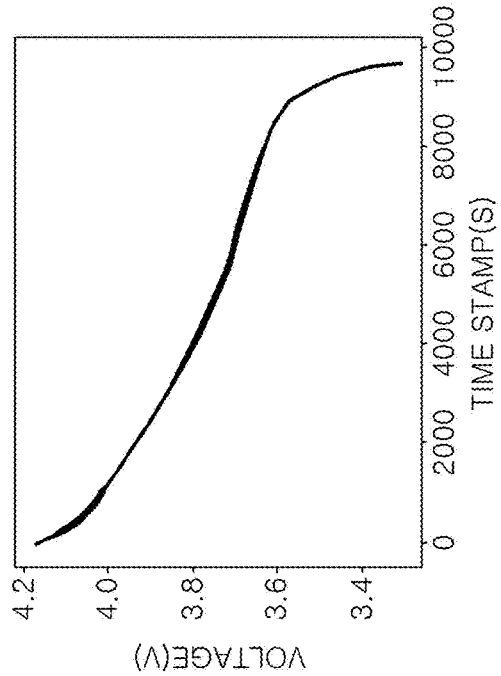
FIGS. 3A to 3D show graphs illustrating a process for calculating voltage distribution entropy from battery voltage distribution for one discharge cycle.
Figure 3D:
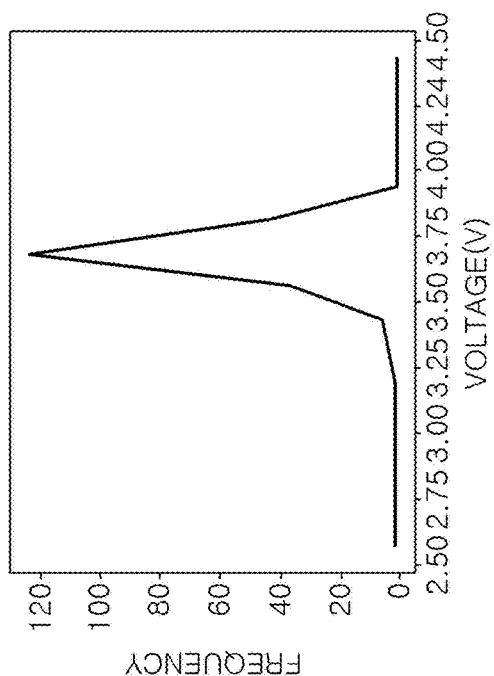
Figure 3A:
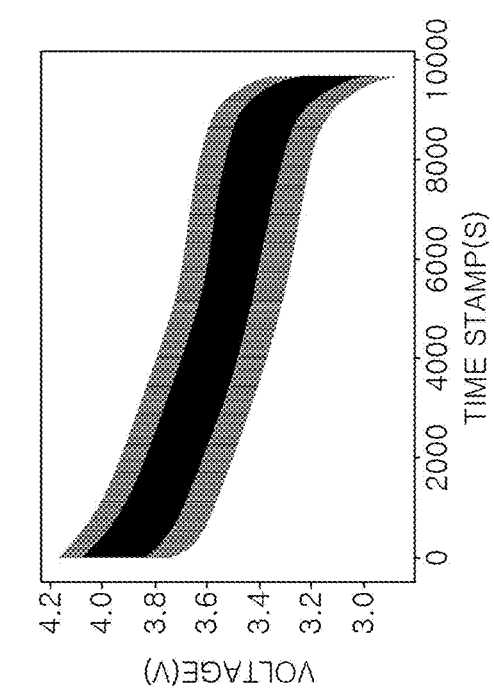

Referring to FIGS. 3A to 3D, a voltage drop occurs by internal resistance of the battery according to a current loaded when a battery is discharged (FIG. 3A). This change in the voltage may cause a change in the entropy if the discharge current is not constant, and thus the voltage may be compensated using an equation 2 before calculating the entropy from the measured voltage distribution (FIG. 3B). In the equation 2, V indicates a voltage, I indicates the load current, and $R_i$ indicates the internal resistance. Here, the internal resistance $R_i$ has a linear relationship with the SOH of the battery as shown in an equation 3, and the parameters a and b in the equation 3 may be determined according to characteristics of the battery. In the embodiment, the aging state was estimated for a battery having the parameter a of −0.082 and the parameter b of 0.21.

$$V=IR_i \qquad \text{<Equation 2>}$$

$$R_i=a\times SOH+b \qquad \text{<Equation 3>}$$

Figure 3C:
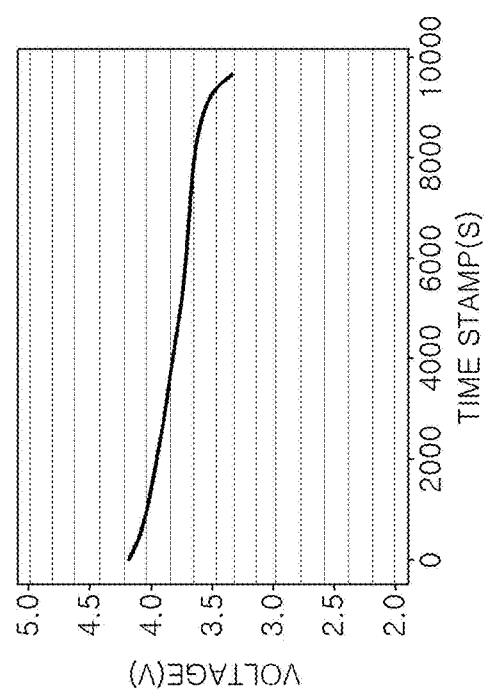

Next, an arbitrary minimum voltage and an arbitrary maximum voltage are set for the compensated voltage (FIG. 3B), and this voltage range is divided into an arbitrary number of sections with equal intervals (FIG. 3C). Thereafter, a histogram may be obtained by displaying the frequency (the frequent occurrence) of the voltage for each section (FIG. 3D). The discharge voltage distribution entropy may be calculated according to an equation 4 by using the histogram. In the equation 4, H(x) indicates the discharge voltage distribution entropy, $x_i$ indicates an i-th section of the histogram, $p(x_i)$ indicates the probability that the voltage corresponding to the $x_i$ appears, and N indicates the number of sections.

$$H(x) = -\sum_{i=1}^{N} p(x_i)\log_b p(x_i). \qquad \text{<Equation 4>}$$

The discharge current distribution entropy may be calculated in the same manner of calculating the discharge voltage distribution entropy.

Figure 4:
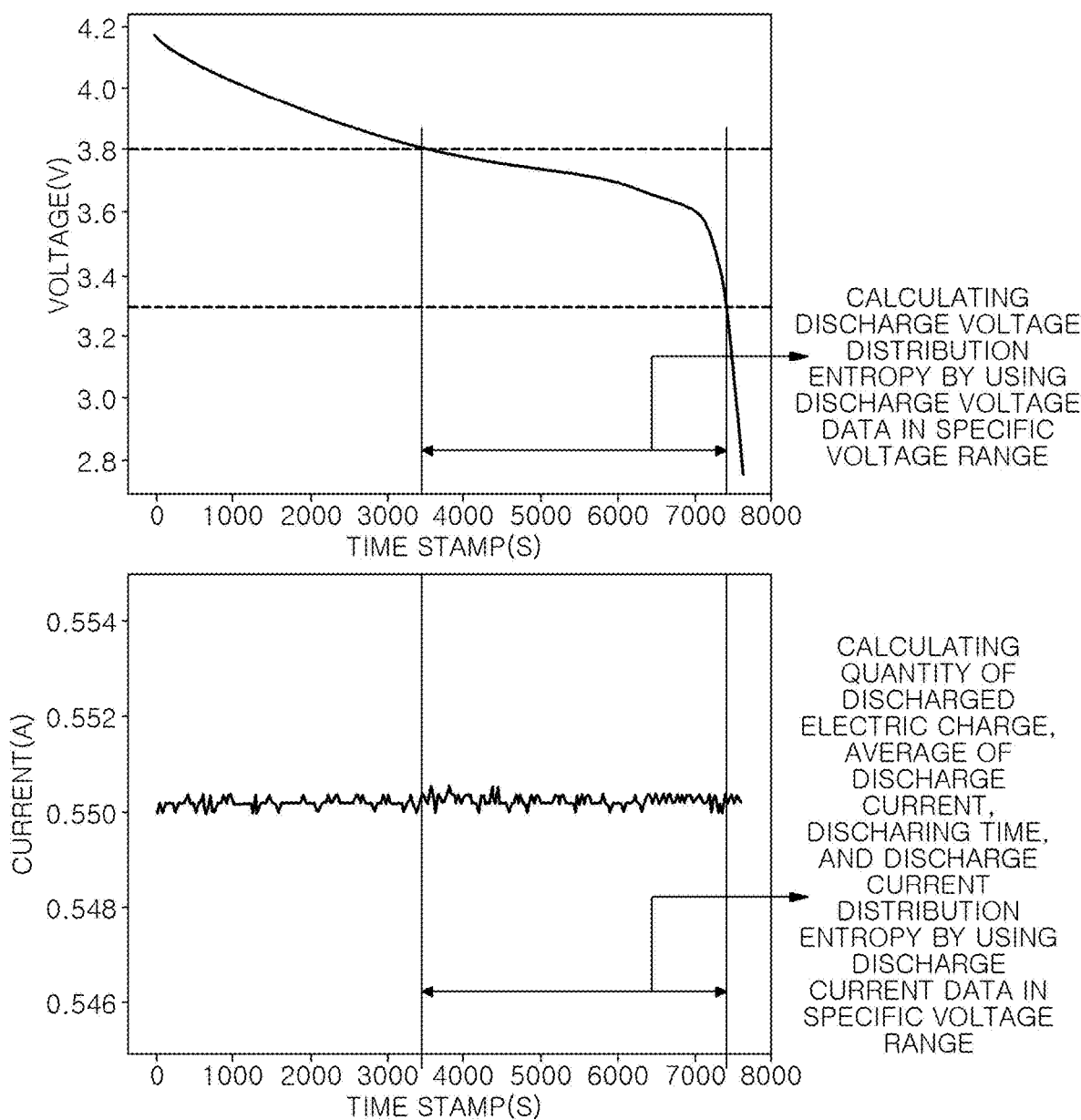
FIG. 4 shows graphs illustrating a method for calculating voltage distribution entropy, a quantity of discharged electric charge, an average of a discharge current, discharging time, and discharge current distribution entropy by using battery measurement values in a partial range of the entire voltage range from an upper limit cutoff voltage to a lower limit cutoff voltage.

FIG. 4 shows graphs illustrating a method for calculating the discharge voltage distribution entropy, the quantity of the discharged electric charge, the average of the discharge current, the discharging time, and the discharge current distribution entropy by using battery measurement values in a partial range of the entire voltage range from an upper limit cutoff voltage to a lower limit cutoff voltage.

For the determination of whether the battery is fully charged or completely discharged, it is determined as a fully charged state when the voltage of the battery reaches specific upper limit cutoff voltage, and it is determined as a completely discharged state when the voltage of the battery reaches specific lower limit cutoff voltage. In general, when a user uses a battery, the battery is not always fully charged or completely discharged. In order to consider this actual usage environment, when calculating the discharge voltage distribution entropy, the quantity of the discharged electric charge, the average of the discharge current, the discharging time, and the discharge current distribution entropy, the measurement values for the partial range of the entire voltage range from the upper limit cutoff voltage to the lower limit cutoff voltage other than the entire voltage range may be used as shown in FIG. 4.

Figure 5:
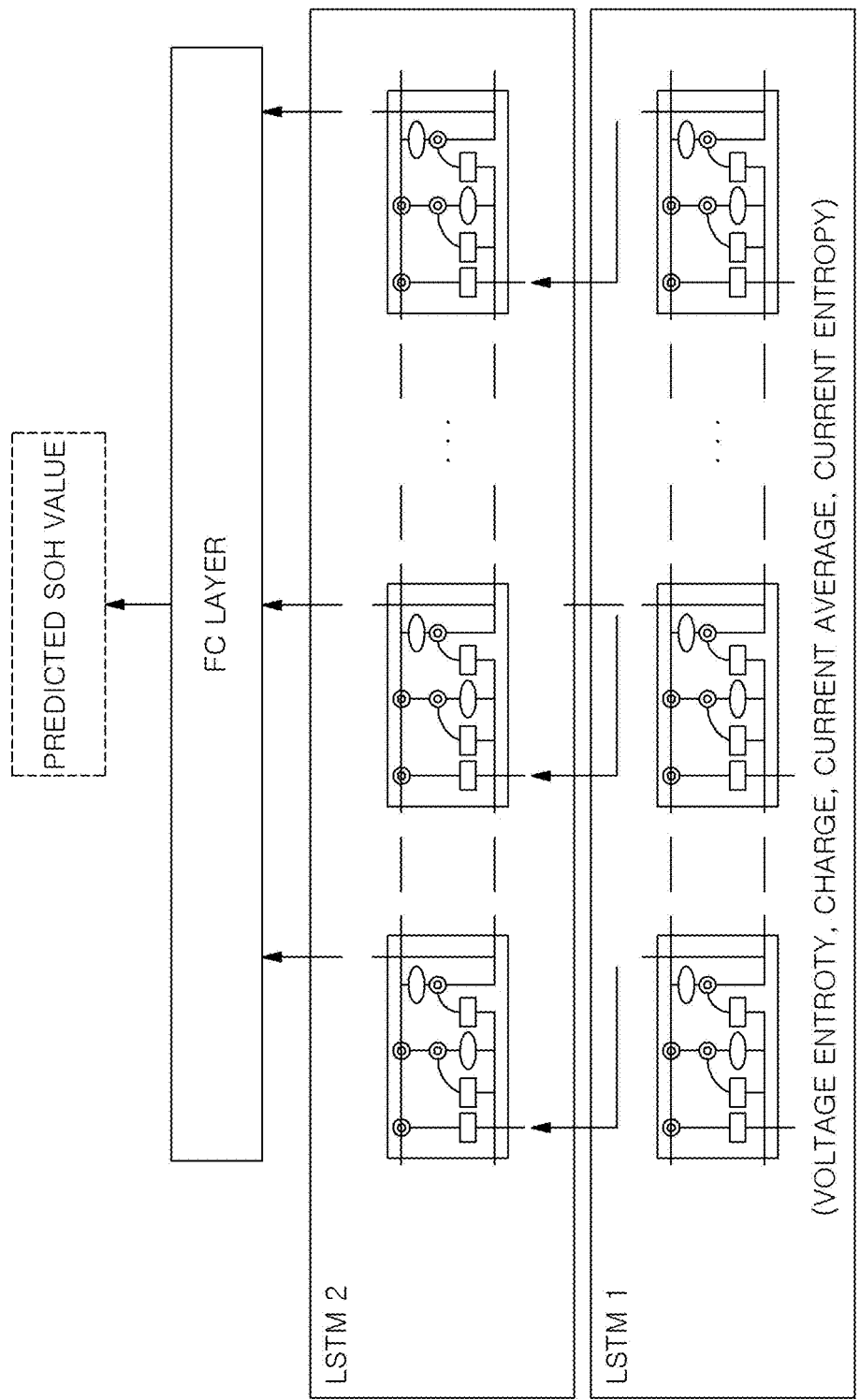
FIG. 5 shows a method for estimating the aging state of the battery by using a long-short term memory.

FIG. 5 shows a method for estimating the aging state of the battery by using the LSTM.

The aging state of the battery may be estimated by using the discharge voltage distribution entropy, the quantity of the discharged electric charge, the average of the discharge current, the discharging time, and the discharge current distribution entropy for one discharge cycle of the battery as inputs to a machine learning model. In general, since a feature for estimating the aging state of the battery has a time-series characteristic, the LSTM may be used to reflect the time-series characteristic.

Referring to FIG. 5, the machine learning model may include two LSTM layers and one fully connected layer (FC layer). Each LSTM unit included in the LSTM layers may be stacked while being interconnected with a neighboring unit, and the FC layer may predict a SOH of a next discharge cycle by receiving all outputs of the last LSTM layer as an input. At this time, in order to predict the SOH of the next discharge cycle, an n-dimensional vector including the discharge voltage distribution entropy, the quantity of the discharged electric charge, the average of the discharge current, the discharging time, and the discharge current distribution entropy may be used as an input vector, and input vectors from the current discharge cycle up to the k number of previous discharge cycles may be used as a feature sequence.

If the size of the data used as the input in a neural network is different, the performance of the machine learning model may be degraded. Therefore, each component of the input vector may be converted into a value between 0 and 1 by using a Min-Max Scaler as shown in an equation 5. In the equation 5, x indicates each component of the input vector before the conversion, $x_{scale}$ indicates each component of the input vector after the conversion, $x_{min}$ indicates the minimum value of x, and $x_{max}$ indicates the maximum value of x.

$$x_{scale} = \frac{x - x_{min}}{x_{max} - x_{min}} \qquad \text{<Equation 5>}$$

Figure 6:
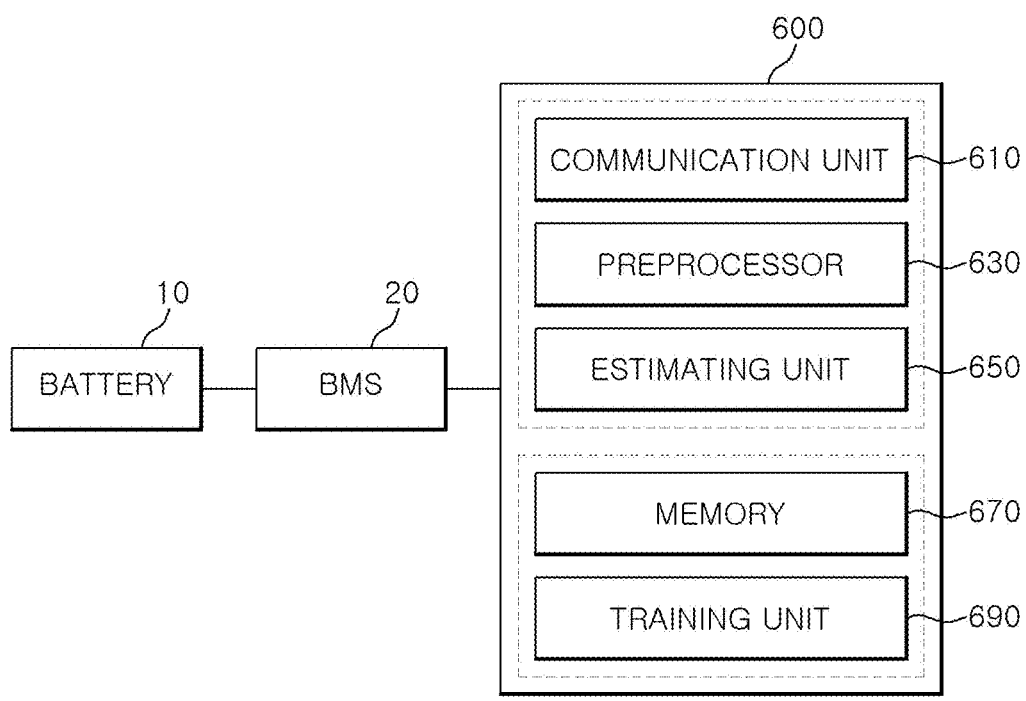
FIG. 6 shows a diagram illustrating a configuration of a battery aging state estimating apparatus according to the embodiment of the present disclosure.

FIG. 6 shows a configuration of a battery aging state estimating apparatus 600 according to the embodiment of the present disclosure.

Referring to FIG. 6, a battery 10 is an energy conversion device that converts chemical energy into electrical energy. For example, the battery 10 may be a lithium-ion (Li-ion) battery. The battery 10 may be configured in units of packages or cells.

A BMS 20 is an electronic system for monitoring a state of the battery 10 and managing the battery 10. For example, the BMS 20 may measure at least one of a voltage, a current, an internal resistance, a temperature, a power, and a SOC of the battery 10, and one or more measurement values may be transmitted to the battery aging state estimating apparatus 600.

The battery aging state estimating apparatus 600 includes a communication unit 610, a preprocessor 630, an estimating unit 650, a memory 670, and a training unit 690.

The communication unit 610 receives the measurement values of the battery 10 from the BMS 20. For example, the communication unit 610 may receive at least one measurement value of the voltage, the current, the internal resistance, the temperature, the power, and the SOC of the battery 10 from the BMS 20.

The communication unit 610 may use a communication method suitable for an implementation form of the battery aging state estimating apparatus 600. For example, the communication unit 610 may use a wired communication method such as a controller area network (CAN) or Ethernet when the battery aging state estimating apparatus 600 is installed as a module inside an electric vehicle, and may use a long-distance wireless communication method when the battery aging state estimating apparatus 600 is provided outside the electric vehicle.

The preprocessor 630 pre-processes the data collected through the communication unit 610. The preprocessor 630 stores the data collected through the communication unit 610 in the memory 670, and calculates, from the stored data, discharge voltage distribution entropy, a quantity of discharged electric charge, an average of a discharge current, discharging time, and discharge current distribution entropy used for estimating an aging state of the battery 10.

The estimating unit 650 estimates the aging state of the battery 10 by using a pre-trained machine learning model.

The memory 670 stores the data preprocessed by the preprocessor 630 and an estimated model and a parameter learned by the training unit 690.

The training unit 690 trains the machine learning model. The machine learning model may use an n-dimensional vector including the discharge voltage distribution entropy, the quantity of the discharged electric charge, the average of the discharge current, the discharging time, and the discharge current distribution entropy as an input vector.

The memory 670 and the training unit 690 may be implemented integrally with the communication unit 610, the preprocessor 630, and the estimating unit 650 depending on an embodiment, or may be implemented separately from the communication unit 610, the preprocessor 630, and the estimating unit 650.

Hereinafter, experimental results to which the battery aging state estimating method according to the embodiment of the present disclosure is applied will be described.

FIG. 7 shows a table illustrating training data and test data used in experiments to which the battery aging state estimating method according to the embodiment of the present disclosure is applied.

In the experiments, a SOH of the battery 10 is predicted both in a case in which a discharge current is constant and in another case in which the discharge current is changed for each discharge cycle. Further, a dataset provided by Maryland University's Center for Advanced Life Cycle Engineering (CALCE) is used. The CALCE dataset is collected while performing a process of fully charging and completely discharging a lithium-ion battery of 1.1 Ah with a constant current.

In FIG. 7, a dataset CS2_33 and a dataset CS2_34 are collected by repeating a process of discharging the battery with a current of 0.55 A and then charging the battery with the current of 0.55 A. A dataset CS2_35, a dataset CS2_36, a dataset CS2_37, and a dataset CS2_38 are collected by repeating a process of discharging the battery with a current of 1.1 A and then charging the battery with the current of 0.55 A. A dataset CS2_3 is collected by repeating a process of discharging the battery with a discharge current while changing the discharge current for each discharge cycle in order of 0.11 A, 0.22 A, 0.55 A, 1.1 A, 1.65 A, and 2.2 A.

Referring to FIG. 7, in an experiment 1, the battery is discharged at a constant current for all the discharge cycles. Specifically, the dataset collected by constantly discharging the battery with the current of 0.55 A (e.g., CS2_33, CS2_34) and the dataset collected by constantly discharging the battery with the current of 1.1 A (e.g., CS2_35, CS2_36, CS2_37, CS2_38) are used. Here, the datasets CS2_33, CS2_35, CS2_37 and CS2_38 are used as the training data and the datasets CS2_34 and CS2_36 are used as the test data.

In an experiment 2, the battery is discharged at a constant current for all the discharge cycles, and 60% of data is randomly selected from each selected dataset (e.g., CS2_33, CS2_34, CS2_35, CS2_37, CS2_38) to be used as the training data, and 40% of data, which is not included in the training data, is selected from each selected dataset (e.g., CS2_34, CS2_35) to be used as the test data.

In an experiment 3, the discharge current is changed for each discharge cycle. Specifically, CS2_3 data is used, and 60% of data is randomly selected from the dataset CS2_3 to be used as the training data and the remaining 40% of data from the dataset CS2_3 to be used as the test data.

In an experiment 4, a case in which the discharge current is constant for all the discharge cycles and a case in which the discharge current changes for each discharge cycle are combined. Specifically, all of the data for the datasets CS2_33, CS2_35, and CS2_38 and 60% of data randomly selected from the dataset CS2_3 are used as the training data. Further, all of the data for the datasets CS2_34 and CS2_36 and the remaining 40% of data selected from the dataset CS2_3 are used as the test data.

In an experiment 5, the case in which the discharge current is constant for all the discharge cycles and the case in which the discharge current changes for each discharge cycle are combined, and 60% of data is randomly selected from each selected dataset (e.g., CS2_33, CS2_34, CS2_35, CS2_38, CS2_3) to be used as the training data, and 40% of data, which is not included in the training data, is selected from each selected dataset (e.g., CS2_34, CS2_35, CS2_3) to be used as the test data.

FIG. 8 shows a table illustrating the results of the experiments to which the battery aging state estimating method according to the embodiment of the present disclosure is applied.

Referring to FIG. 8, when the SOH is estimated by using the discharge voltage distribution entropy, the quantity of the discharged electric charge, the discharging time, and the average of the discharge current, most results have the accuracy of 98% or more, except for the case where the dataset collected by constantly discharging the battery with the current of 0.55 A in the experiment 5 is used as the test data.

Figure 10A:
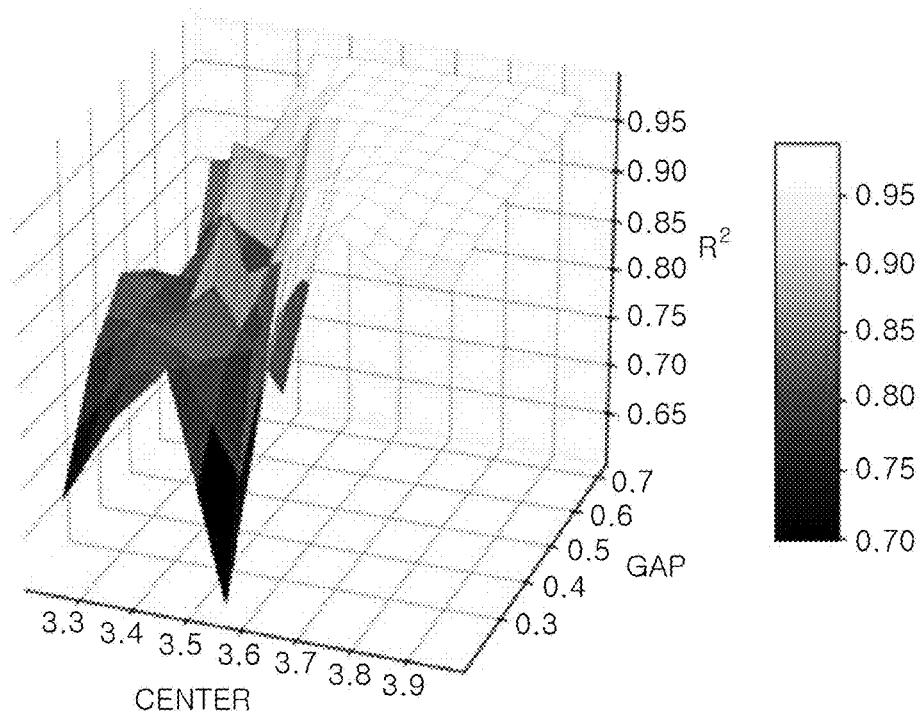
FIGS. 10A and 10B show graphs illustrating the accuracy of estimating the aging state of the battery for each partial range.
Figure 10B:
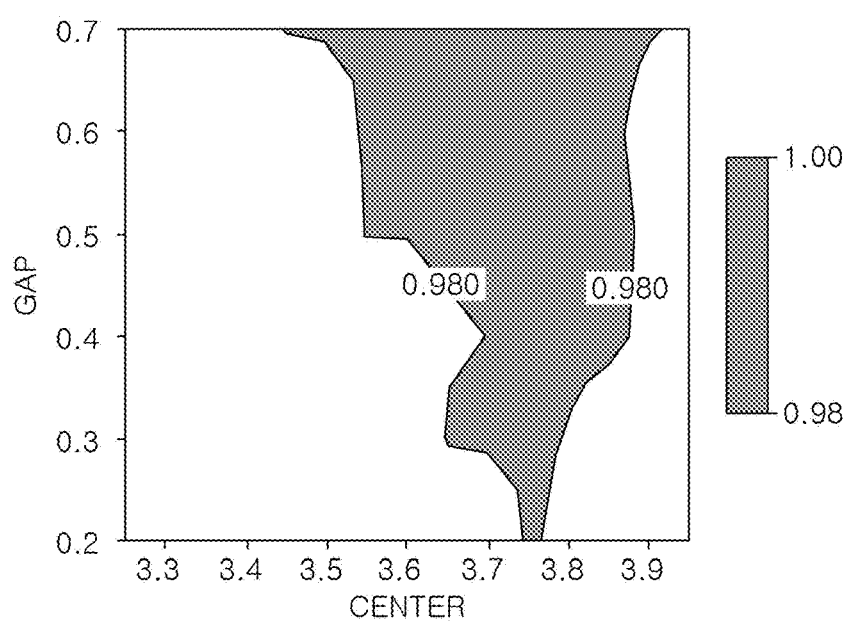

FIG. 9 shows a table illustrating the results of experiments to which the battery aging state estimating method is applied by using the battery measurement values in a partial range of the entire voltage range from an upper limit cutoff voltage to a lower limit cutoff voltage according to the embodiment of the present disclosure, and FIGS. 10A and 10B show graphs illustrating the accuracy of estimating the battery aging state for each partial range.

In FIGS. 9 to 10B, in order to consider the case where the user does not fully charge and completely discharge the battery, the SOH is estimated for the partial data of the entire voltage data (i.e., data in the partial range of the entire voltage range from the upper limit cutoff voltage to the lower limit cutoff voltage) by using, as an input vector, the discharge voltage distribution entropy, the quantity of the discharged electric charge, the average of the discharge current, and the discharging time. In this case, the training data and the test data used in the experiment 4 are used. The estimated result of the SOH for each partial range is shown in FIG. 9, and the accuracy is measured by using the average of root mean square error (RMSE) and the average of $R^2$ of each test data.

FIG. 10A shows the accuracy of each partial range used to estimate the battery aging state, and FIG. 10B shows a partial range where the accuracy is 98%. According to the results of FIGS. 9 to 10B, the accuracy decreases as an interval of voltage is smaller, and the accuracy increases when a high voltage range is included. The highest accuracy is observed in the voltage range from 3.4V to 3.9V, and the accuracy of 98% or more is observed with respect to $R^2$ even when the voltage range from 3.6V to 3.9V having the minimum interval is used. In general, the voltage becomes 4.2V when the battery is fully charged and the voltage becomes 2.7V when the battery is completely discharged. Thus, the aforementioned voltage ranges correspond to the voltage ranges that the user mainly uses. Therefore, it is confirmed that even though the partial range of the entire voltage range is used, the estimation performance is similar to that of the case where the entire data (all the measurement values in the entire voltage range) is used.

FIG. 11 shows a table illustrating results of experiments to which the battery aging state estimating method according to the embodiment of the present disclosure is applied in a case where a discharge current is randomly changed within each discharge cycle.

In FIG. 11, battery data is additionally collected to estimate the battery aging state when the discharge current is randomly changed within each discharge cycle. The additional data is collected in a case where the discharge current is randomly changed in a range between 0.5 A and 2.5 A, a case where the discharge current is randomly changed in a range between 0.5 A and 4 A, and a case where the discharge current is changed in a range between 0 A and 3.5 A. Referring to FIG. 11, in most cases, the accuracy of at least 95% or more is observed.

The battery aging state estimating method according to the present disclosure described above may be implemented as computer-readable codes (computer-executable codes (instructions)) on a non-transitory computer-readable storage medium. The non-transitory computer-readable storage medium includes any type of storage medium in which data that may be deciphered by a computer system is stored. For example, the non-transitory computer-readable storage medium may include a read only memory (ROM), a random access memory (RAM), a magnetic tape, a magnetic disk, a flash memory, an optical data storage, and the like. In addition, the non-transitory computer-readable storage medium may be distributed among computer systems connected to each other through a communication network, and stored and executed as readable codes in a decentralized manner.

The explanation as set forth above is merely described a technical idea of the exemplary embodiments of the present disclosure, and it will be understood by those skilled in the art to which this disclosure belongs that various changes and modifications is made without departing from the scope and spirit of the claimed invention as disclosed in the accompanying claims. Therefore, the exemplary embodiments disclosed herein are not used to limit the technical idea of the present disclosure, but to explain the present disclosure. The scope of the claimed invention is to be determined by not only the following claims but also their equivalents. Specific terms used in this disclosure and drawings are used for illustrative purposes and not to be considered as limitations of the present disclosure. Therefore, the scope of the claimed invention is construed as defined in the following claims and changes, modifications and equivalents that fall within the technical idea of the present disclosure are intended to be embraced by the scope of the claimed invention.

What is claimed is:

1. A method for estimating an aging state of a battery, the method comprising:

receiving measurement values of the battery from a battery management system;

calculating factors representing change characteristics of each of a discharge voltage and a discharge current in each of charge/discharge cycles by using the measurement values of the battery; and estimating, based on an n-dimensional vector (n is a natural number) including the calculated factors, the aging state of the battery by using a machine learning model that is pre-trained by using, as an input vector, an n-dimensional vector including factors representing change characteristics of each of a discharge voltage and a discharge current in each of charge/discharge cycles of each battery for use in training by using measurement values of the battery for use in training, wherein the aging state of the battery is estimated while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles, and wherein the machine learning model is pre-trained while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles.

2. The method of claim 1, wherein the factors include a discharge voltage distribution entropy, a quantity of discharged electric charge, an average of the discharge current, and a discharge time, and further include at least one of a discharge current variance and a discharge current distribution entropy.

3. The method of claim 2, wherein the discharge voltage distribution entropy is calculated by compensating a discharge voltage drop occurred by internal resistance of the battery, generating a histogram for the compensated discharge voltage, and using a probability of each section of the histogram.

4. The method of claim 3, wherein the compensated discharge voltage is calculated by an equation $V=IR_i$, and wherein V is the compensated discharge voltage, I is the discharge current, and $R_i$ is the internal resistance.

5. The method of claim 4, wherein the internal resistance is calculated by and an equation $R_i = a \times SOH + 6$, wherein $R_i$ is the internal resistance, SOH is a state of health of the battery, and a and b are coefficients determined according to a characteristic of the battery.

6. The method of claim 3, wherein the discharge voltage distribution entropy is calculated by an equation $$H(x) = -\sum_{i=1}^{N} p(x_i) \log_b p(x_i),$$

and wherein H(x) is the discharge voltage distribution entropy, $x_i$ is an i-th section of the histogram, $p(x_i)$ is a probability that a voltage corresponding to the $x_i$ appears, and N is the number of sections.

7. The method of claim 1, wherein, in the calculating of the factors, the factors are calculated by using, among the measurement values of the battery, measurement values measured in a predetermined partial voltage range that is effective in estimating a state of health (SOH) in a case in which charging and discharging of the battery are not fully performed.

8. The method of claim 1, wherein the machine learning model is a long-short term memory.

9. The method of claim 8, wherein each component of the n-dimensional vector is converted into a value between 0 and 1 and input to the machine learning model by an equation $$x_{scale} = \frac{x - x_{min}}{x_{max} - x_{min}},$$

and
wherein x is each component of the n-dimensional vector before the conversion, $X_{scale}$ is each component of the n-dimensional vector after the conversion, $X_{min}$ is the minimum value of x, and $X_{max}$ is the maximum value of x.

10. An apparatus for estimating an aging state of a battery, the apparatus comprising:
a communication unit configured to receive measurement values of the battery from a battery management system;
a preprocessor configured to calculate factors representing change characteristics of each of a discharge voltage and a discharge current in each of charge/discharge cycles by using the measurement values of the battery; and
an estimating unit configured to estimate, based on an n-dimensional vector (n is a natural number) including the calculated factors, the aging state of the battery by using a machine learning model that is pre-trained by using, as an input vector, an n-dimensional vector including factors representing change characteristics of each of a discharge voltage and a discharge current in each of charge/discharge cycles of each battery for use in training by using measurement values of the battery for use in training,
wherein the aging state of the battery is estimated while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles, and
wherein the machine learning model is pre-trained while the charge/discharge cycles include at least one cycle in which the battery for use in training is discharged before the battery for use in training is fully charged and the battery for use in training is charged before the battery for use in training is completely discharged, and a load current pattern of the battery for use in training is varying within each discharge cycle of the charge/discharge cycles.

11. The apparatus of claim 10, wherein the factors include a discharge voltage distribution entropy, a quantity of discharged electric charge, an average of the discharge current, and a discharge time, and further include at least one of a discharge current variance and a discharge current distribution entropy.

12. The apparatus of claim 11, wherein the discharge voltage distribution entropy is calculated by compensating a discharge voltage drop occurred by internal resistance of the battery, generating a histogram for the compensated discharge voltage, and using a probability of each section of the histogram.

13. The apparatus of claim 12, wherein the compensated discharge voltage is calculated by an equation $V=IR_i$, and
wherein V is the compensated discharge voltage, I is the discharge current, and $R_i$ is the internal resistance.

14. The apparatus of claim 13, wherein the internal resistance is calculated by an equation $R_i=\alpha \times SOH+6$, and
wherein $R_i$ is the internal resistance, SOH is a state of health of the battery, and a and the b are coefficients determined according to a characteristic of the battery.

15. The apparatus of claim 12, wherein the discharge voltage distribution entropy is calculated by an equation $$H(x) = -\sum_{i=1}^{N} p(x_i) \log_b p(x_i),$$

and
wherein H(x) is the discharge voltage distribution entropy, $x_i$ is an i-th section of the histogram, $p(x_i)$ is a probability that a voltage corresponding to the $x_i$ appears, and N is the number of sections.

16. The apparatus of claim 10, wherein the preprocessor is configured to calculate the factors by using, among the measurement values of the battery, measurement values measured in a predetermined partial voltage range that is effective in estimating a state of health (SOH) in a case in which charging and discharging of the battery are not fully performed.

17. The apparatus of claim 10, wherein the machine learning model is a long-short term memory.

18. The apparatus of claim 17, wherein each component of the n-dimensional vector is converted into a value between 0 and 1 and input to the machine learning model by an equation $$x_{scale} = \frac{x - x_{min}}{x_{max} - x_{min}},$$

and
wherein x is each component of the n-dimensional vector before the conversion, $X_{scale}$ is each component of the n-dimensional vector after the conversion, $X_{min}$ is the minimum value of x, and $X_{max}$ is the maximum value of x.

19. A battery aging state estimating apparatus that is implemented outside a transportation means including a battery and is capable of communicating with the transportation means in a wireless communication manner, the battery aging state estimating apparatus comprising:
a communication unit configured to receive measurement values of the battery from a battery management system;
a preprocessor configured to calculate factors representing change characteristics of each of a discharge voltage and a discharge current in each of charge/discharge cycles by using the measurement values of the battery; and an estimating unit configured to estimate, based on an n-dimensional vector (n is a natural number) including the calculated factors, an aging state of the battery by using a machine learning model that is pre-trained by using, as an input vector, an n-dimensional vector including factors representing change characteristics of each of a discharge voltage and a discharge current in each of charge/discharge cycles of each battery for use in training by using measurement values of the battery for use in training, wherein the aging state of the battery is estimated while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles, and wherein the machine learning model is pre-trained while the charge/discharge cycles include at least one cycle in which the battery for use in training is discharged before the battery for training is fully charged and the battery for use in training is charged before the battery for use in training is completely discharged, and a load current pattern of the battery for use in training is varying within each discharge cycle of the charge/discharge cycles.

* * * * *